(12) United States Patent
Kobayashi

(10) Patent No.: US 6,479,397 B2
(45) Date of Patent: Nov. 12, 2002

(54) METHOD FOR FORMING ISOLATION REGIONS ON SEMICONDUCTOR DEVICE

(75) Inventor: Motoki Kobayashi, Kanagawa (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/847,274

(22) Filed: May 3, 2001

(65) Prior Publication Data

US 2002/0052118 A1 May 2, 2002

(30) Foreign Application Priority Data

Oct. 27, 2000 (JP) ........................................ 2000-328213

(51) Int. Cl.⁷ ............................................. H01L 21/00
(52) U.S. Cl. ..................... 438/724; 134/1.2; 134/1.3; 216/67; 216/79; 216/99; 438/744; 438/757
(58) Field of Search ................................ 438/710, 723, 438/724, 740, 743, 744, 745, 756, 757; 134/1.2, 1.3, 2, 31; 216/39, 67, 79, 99

(56) References Cited

U.S. PATENT DOCUMENTS 4,484,979 A * 11/1984 Stocker ...................... 438/713
4,560,436 A * 12/1985 Bukhman et al. ......... 438/713 X
5,660,682 A * 8/1997 Zhao et al. ................ 438/725 X

FOREIGN PATENT DOCUMENTS

| JP | 06-236864 | 8/1994 |
| JP | 06-283460 | 10/1994 |

* cited by examiner

*Primary Examiner*—William A. Powell
(74) *Attorney, Agent, or Firm*—Volentine Francos, PLLC

(57) ABSTRACT

A method for forming an isolation region on a semiconductor substrate with a high yield, comprising partially covering the surface of a semiconductor substrate with an oxidation inhibitor film, depositing a material for side-wall parts on the oxidation inhibitor film and also on an exposed region of the surface, which is revealed through an opening of the oxidation inhibitor film, to form side-wall parts at the edge portions of the oxidation inhibitor film, then, removing by a plasma etching process the unnecessary portions of said side-wall material deposited on the oxidation inhibitor film and on the exposed region of the substrate and leaving intact the side-wall parts at the edge portions of the oxidation inhibitor film, and cleaning the exposed region on the surface of the semiconductor substrate, revealed through the opening of the oxidation inhibitor film, before subsequent heat treatment to generate a field oxide film.

5 Claims, 6 Drawing Sheets

METHOD FOR FORMING ISOLATION REGIONS ON SEMICONDUCTOR DEVICE

BACKGROUND OF THE INVENTION

1. Field of the Invention

The present invention relates to a method for manufacturing a semiconductor device, such as a semiconductor integrated circuit, and more particularly to a method for forming isolation regions to delimit active regions on a semiconductor substrate.

2. Prior Art

To electrically isolate the active regions, where semiconductor devices, such as transistors, are formed, on a silicon semiconductor substrate for example, isolation regions made of silicon oxide are generally formed, and semiconductor devices are formed as required in the active regions delimited by the isolation regions.

One of the above-mentioned methods for forming an isolation region is the LOCOS isolation process. According to this process, the surface of a silicon semiconductor substrate is partially covered with an oxidation inhibitor film formed by a silicon nitride film, for example, which has been patterned, and the regions of the surface of the semiconductor substrate which are exposed through the openings of the oxidation inhibitor film can be oxidized locally by thermal oxidation. Therefore, isolation regions are formed by a field oxide film made of silicon oxide generated by the oxidation process mentioned above.

Incidentally, as an improved type of the LOCOS process, there is the FLOCOS (Flamed LOCOS) process. According to this proior improved technique, side-walls are provided at the edge portions of a patterned opening in an oxidation inhibitor film to enable patterning of finer patterns in an oxidation inhibitor film than specified in the design rule applicable to patterning of oxidation inhibitor films, so that finer isolation regions can be obtained than are specified in the pattern design rule. Moreover, it becomes possible to inhibit the so-called bird's beak of the isolation region from encroaching into the active region.

However, in the conventional FLOCOS isolation process in which side-walls are provided for the oxidation inhibitor film, even if heat treatment is carried out on the semiconductor substrate to oxidize the region of the surface of the semiconductor substrate which is exposed through the opening of the oxidation inhibitor film, it often happens that the exposed region is not oxidized and therefore an oxide film for use as the isolation region cannot be grown sufficiently. Such a situation is often encountered when isolation regions made of field oxide film are to be located less densely and secluded from one another.

The object of the present invention is to provide an isolation-region forming method by which isolation regions can be formed with a higher yield then before even when the isolation regions are formed sparsely.

SUMMARY OF THE INVENTION

The present invention derived from a basic concept that effects by the deposit, which builds up on the exposed region, should be precluded from heat treatment of the exposed region to generate a field oxide film. This concept was developed from a viewpoint as follows: an insufficient growth of the field oxide film on the exposed region of the surface of the semiconductor substrate, revealed through an opening of the oxidation inhibitor film, in heat treatment of the semiconductor substrate is caused by part of the material for the oxidation inhibitor film building up on the exposed region when the unwanted side-wall material is removed in the formation of the side-walls on the oxidation inhibitor film by the plasma etching process prior to the heat treatment.

According to an aspect of the present invention, there is provided a method for forming an isolation region made of a field oxide film generated by thermal oxidation of an exposed region of the surface of a semiconductor substrate partially covered by an oxidation inhibitor film, comprises partially covering the surface of the semiconductor substrate with an oxidation inhibitor film; depositing a side-wall material on the oxidation inhibitor film and on an exposed region of the surface, revealed through an opening of the oxidation inhibitor film, to form side-wall parts at edge portions of the oxidation inhibitor film by a material having the same function as the oxidation inhibitor film; then, removing by a plasma etching process, unnecessary portions of the side-wall material deposited on the oxidation inhibitor film and on the exposed region of the semiconductor substrate and leaving intact the side-wall parts at the edge portions of the oxidation inhibitor film; and carrying out a cleaning process on the exposed region of the surface of the semiconductor substrate, revealed through an opening of the oxidation inhibitor film, before performing subsequent heat treatment to generate a field oxide film.

According to a second aspect of the present invention, after unnecessary portions of the side-wall material deposited on the oxidation inhibitor film and on the exposed region of the semiconductor substrate are removed, leaving intact the side-wall parts at the edge portions of the oxidation inhibitor film, a cleaning process by an etching process is carried out on the exposed region of the surface of the semiconductor substrate, revealed through an opening of the oxidation inhibitor film, before subsequent heat treatment is performed to generate a field oxide film.

According to a third aspect of the present invention, even if part of the material for the oxidation inhibitor film builds up on the exposed region when the plasma etching process is performed to form the side walls, after removal of the unnecessary side-wall material by the plasma etching process, by the cleaning process performed on the exposed region on the surface of the semiconductor substrate prior to the heat treatment, the deposit may be removed securely from the exposed region, and by the heat treatment on the cleaned semiconductor substrate, an isolation region made of a field oxide film many be formed on the exposed region with a high yield.

According to a fourth aspect of the present invention, as an etching process to be used for removal of the deposit, it is possible to adopt a dry etching process chiefly using radicals or a wet etching process using an etchant. By an etching process such as these, the deposit may be removed securely without having particles of the material of the deposit re-accumulate on the exposed region.

According to a fifth aspect of the present invention, before depositing a material for the side-wall parts, covering the exposed region on the surface of the semiconductor may be covered by an oxide film and after the unnecessary portions of the side-wall material are removed, the oxide film covering the exposed region may be removed by carrying out the cleaning process on the exposed region. Thus, the deposit from the oxidation inhibitor film that accumulates on the oxide film may be removed together with the oxide fill.

According to a sixth aspect of the present invention, another method for forming an isolation region made of a field oxide film generated by thermal oxidation of an exposed region of the surface of a semiconductor substrate partially covered by an oxidation inhibitor film, comprises partially covering the surface of the semiconductor with an oxidation inhibitor film, the surface of the oxidation film being covered by a protective film; depositing a material for side-wall parts on the oxidation inhibitor film and on an exposed region of the surface, revealed through an opening of the oxidation inhibitor film, to form side-wall parts on edge portions of the oxidation inhibitor film by a material having the same function as the oxidation inhibitor film; then, by a plasma etching process, removing unnecessary portions of the side-wall material deposited on the protective film and on the exposed region on the semiconductor surface and leaving intact the side-wall parts on the edge portions of the oxidation inhibitor film; and carrying out heat treatment on the semiconductor substrate to generate the field oxide film.

According to a seventh aspect of the present invention, in the one other method mentioned above, when the unnecessary side-wall material which is not required to form the side wall parts is removed, the protective film covering the oxidation inhibitor film protects the oxidation inhibitor film beneath the protective film from the plasma etching process carried out for the removal, with the result that part of the material for the oxidation inhibitor film is prevented from building up on the exposed region.

Therefore, in heat treatment to generate the field oxide film, the growth of the field oxide film on the exposed region on the surface of the semiconductor substrate is not limited by the deposit unlike in the prior art, so that the field oxide film can be grown securely and the isolation region made of this field oxide film can be grown with a high yield.

BRIEF DESCRIPTION OF THE DRAWING

The present invention will be understood more fully from the detailed description and the accompanying drawings below of the preferred embodiments of the invention.

DESCRIPTION OF THE EMBODIMENTS

Preferred embodiments of the present invention will be described with reference to the accompanying drawings.
<Embodiment 1>
FIGS. 1(a) to 1(h) show a first embodiment of the method for forming an isolation region according to the present invention.

Figure 1A:
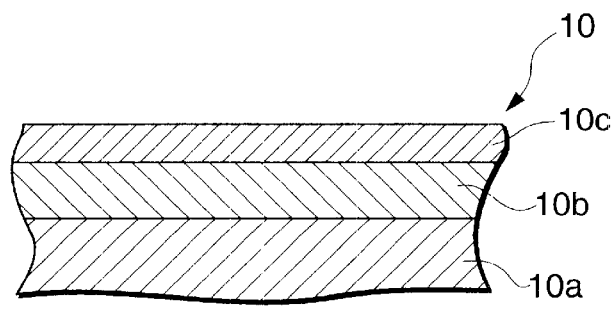
FIGS. 1(a) to 1(h) show the manufacturing steps of a method for forming an isolation region according to a first embodiment of according to the present invention.

In the example illustrated, as a semiconductor substrate 10, a well-known known SOI substrate is used. As shown in FIG. 1(a), the SOI substrate 10 includes a silicon semiconductor crystal plate 10a, an electrically-insulating layer 10b called a BOX layer, which is an electrically-insulating layer of silicon oxide, formed on the silicon semiconductor crystal plate, and a silicon crystal layer 10c called an SOI layer, which is deposited on the BOX layer 10b.

To form an isolation region conforming to a desired pattern on the surface of the substrate 10, an oxidation inhibitor film conforming to a desired pattern to partially expose only the region of the surface, where an isolation region is to be created, is formed on the substrate 10, namely, on the SOI layer 10c.

Figure 1B:
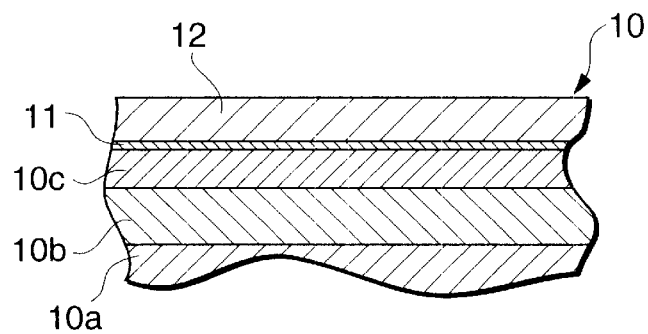

Further, to form an oxidation inhibitor film conforming to the desired pattern, as shown in FIG. 1(b), a silicon nitride layer 12 is formed by CVD for example on the SOI layer 10c of the substrate 10 through the intermediary of a pad layer 11 of silicon oxide.

The pad film 11, as is well known, serves to lessen the distortion by a difference in thermal expansion between the SOI layer 10c as the surface layer of the substrate 10 and the silicon nitride layer 12 covering the SOI layer in heat treatment of the substrate 10, which will be described later.

Figure 1C:
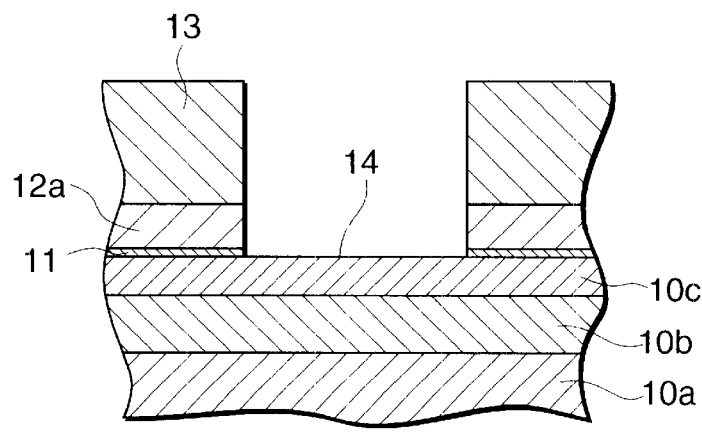

As shown in FIG. 1(c), a resist film 13 patterned to cover the active region of the desired pattern is formed by a well-known lithographcal technique. The exposed region 14 of the silicon nitride layer 12 revealed through an, opening of the resist film 13 and the pad film 11 beneath the exposed region are partially removed by a well-known dry etching process using an etching gas and the resist film 13 as the etching mask.

By this drying etching process, the silicon nitride film 12a is formed in the desired pattern defined by the resist 13, and the SOI layer 10c of the substrate 10 is partially exposed through the opening of the remaining silicon nitride film 12a on the SOI layer after the patterning mentioned above.

Figure 1D:
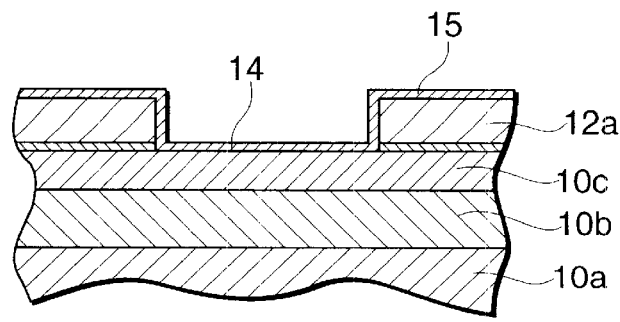

As shown in FIG. 1(d), to form side-wall parts on the patterned silicon nitride film 12a, a silicon nitride film layer 15 with a substantially uniform thickness is formed by CVD, for example, on the silicon nitride film 12a and on the exposed region 14 of the SOI layer 10c which is revealed through an opening the silicon nitride film 12a.

To form the side-wall parts covering the edge portions of the silicon nitride film 12a by removal of unnecessary portions of the silicon nitride film 15 made of a side-wall material, a plasma etching process called reactive ion etching is performed, as is well known, by holding the reactive gas in a plasma state and irradiating the ionized gas to an object by electric field effect.

Figure 1E:
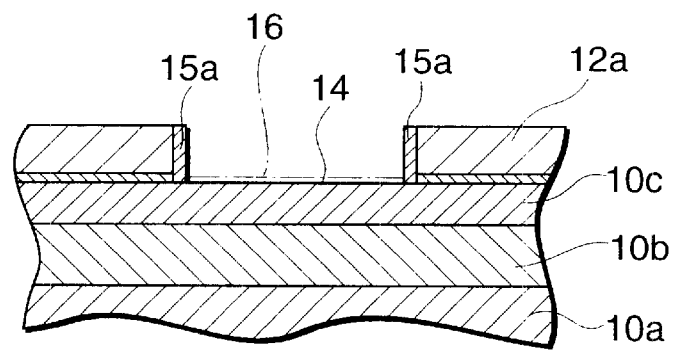

By the above plasma etching process, as shown in FIG. 1(e), the unnecessary portions of the side-wall material 15, specifically, one on the exposed region 14 of the SOI layer 10c revealed through the opening of the silicon nitride film 12a and the other portion on the silicon nitride film 12a, are removed. Therefore, well-known side-wall parts 15a, made of the same material as with the silicon nitride film 12a and covering the edge portions of the silicon nitride film 12a, are formed above the exposed region 14 of the SOI layer 10c.

After the side-wall parts 15a are formed, the substrate 10 is heat-treated to thermally oxidize the exposed region through the opening of the silicon nitride film 12a. Prior to this heat treatment, the exposed region 14 undergoes a cleaning process in the above-mentioned method according to the present invention.

As the above cleaning process of the exposed region 14 of the SOI layer 10c, the exposed region is cleaned by an etching process.

For this etching process, a dry etching system is employed which uses an etching gas. By the etching process using the dry etching system, the very thin layer on the surface of the SOI layer 10c is removed. For this purpose, as the etching system, a down-flow plasma etching system is desirably employed which chiefly uses radicals.

An example of operating conditions of the down-flow plasma etching system is as follows.

As etching gases, O2/CF4 were supplied at 60 sccm/100 sccm to the etching chamber. The pressure of the etching chamber was 1.0 mTorr. The high frequency output (RF power) was 300 W. The etching process time was 9 sec.

The etching conditions are not limited to the values shown in the above example, but may be selected suitably in such a range as not causing a severe damage to the exposed region 14.

In stead of the above dry etching process, the exposed region 14 may be cleaned by a wet etching process using an etchant, such as phosphoric acid.

For this wet etching, a well-known dip-type draft system may be used. By the draft system, the exposed region 14 can be subjected to an etching process for 3 minutes by using phosphoric acid at 140° C., for example. By the etching process under this condition, the exposed region can be cleaned without removing loving the side-wall parts 15a.

The etching conditions are not limited to the values shown in the above example, but may be selected suitably in a range that allows the exposed region 14 to be cleaned without removing the side-wall parts 15a.

By the dry etching or wet etching process mentioned above, the exposed region 14 of the SOI layer 10c is cleaned.

Figure 1F:
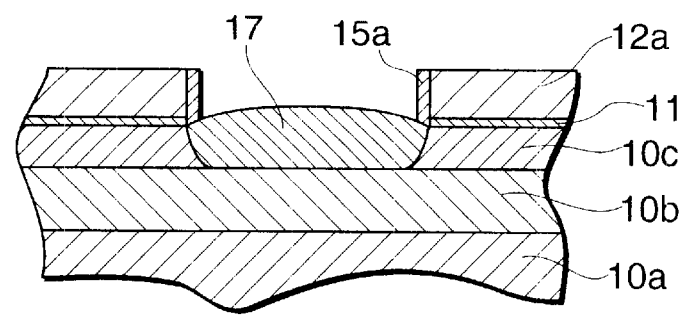

After the exposed region is cleaned by the etching process, when the substrate 10 is heat-treated, as shown in FIG. 1(f), the exposed region 14 revealed through the opening of the silicon nitride film 12a is, as it is oxidized, transformed into a region of silicon oxide continuous to the pad film 11 of silicon oxide while on the contrary the portion of the SOI layer 10c of silicon crystal, located beneath the silicon nitride 12a, is not oxidized owing to the well-known silicon nitride film's function to inhibit the growth of an oxide film.

However, in the prior art that performs heat treatment without carrying out the cleaning process on the exposed region 14 by etching as mentioned above, as described when reference was made to the prior art, the exposed region could not oftentimes be exposed sufficiently.

In the plasma etching process for forming the side-wall parts 15a as described with reference to FIG. 1(e), a large quantity of side-wall material, that is silicon nitride adhering to the silicon nitride film 12a floats in the plasma atmosphere, and part of the suspended nitride particles accumulates. on the exposed region 14 as shown by n imaginary line 16 in FIG. 1(e). The nitride deposit 16 is considered to inhibit the oxidation and growth of oxide of the SOI layer 10c at the exposed region in the subsequent heat treatment.

The dry etching process performed to clean the exposed region is an etching process using chiefly radicals. Therefore, compared with the plasma etching process to form the side-wall parts 15a, the suspended particles, which result in the formation of the nitride 16, do not fall and build up so much as during the formation of the side-wall parts 15a, so that the exposed region 14 can be cleaned properly.

After the side-wall parts 15a were formed by the, plasma etching process as mentioned above, before the cleaning process was carried out on the exposed region 14, the surface of the exposed region 14 was observed under a fluoroscopic electron microscope. However, the deposit 16 could not be detected in a quantity large enough to clearly determine its presence, nor could the presence of a nitride deposit that inhibits the growth of an oxide film be confirmed.

However, the phenomenon that sufficient oxidation and oxide growth on the exposed region is not observable becomes more notable as the surface area of silicon nitride film 12a considered to be the cause of the deposit becomes wider with respect to the area of the exposed region 14, in other words, as the exposed regions 14 are provided less densely or in a more mutually secluded layout. By cleaning of the exposed region 14 by etching according to the present invention, the exposed region 14 can be oxidized securely. From these facts, it is considered that the nitride 16, which inhibits the oxidation and its growth, builds up on the exposed region 14, and that the deposit 16 is removed from the exposed region 14 by the cleaning process.

In the process of growing the silicon oxide 17 by heat treatment, the side-wall parts 15a are formed on the edge portions of the silicon nitride film 12a. Therefore, as is well known, the silicon oxide 17 can be made smaller in size by the thickness according to the thickness of the side-wall parts 15a than the minimum feature size of the silicon nitride film 12a specified by the design rule, which was applied in patterning of the resist 13. The side-wall parts suppresses the bird's beak, which is known to occur in during the formation of the silicon oxide 17.

Figure 1G:
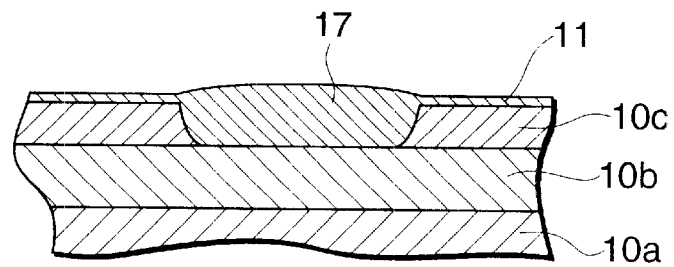
Figure 1H:
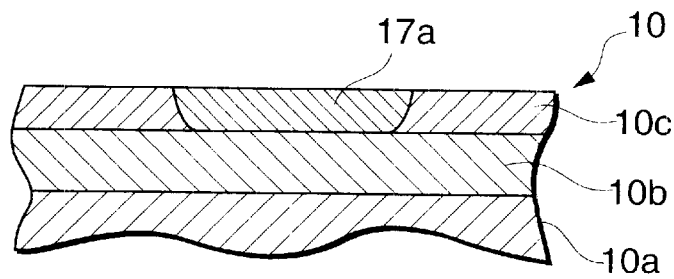

After the formation of the silicon oxide 17, as shown in FIG. 1(g), the silicon nitride 12a and the side-wall parts 15a are removed. When the pad film 11 is exposed accordingly, the pad film 11 and the surface portion of the silicon oxide 17 continuous to the pad film 11 are removed by using a well-known etchant, the surface portion being removed by the amount corresponding to the thickness of the pad film 11. By the etching process, the isolation region 17a, made of the remainder of the silicon oxide 17 and referred to as the field oxide film, is formed in the SOI layer 10c of the substrate 10 as shown in FIG. 1(h).

According to the method of the present invention, as described above, after the side-wall parts 15a are formed at the edge portions of the silicon nitride film 12a, by performing the cleaning process on the exposed region 14 through the opening of the oxidation inhibitor film 12a on the substrate, the substance (16) inhibiting the thermal oxidation can be removed from the exposed region 14. Therefore, by the subsequent heat treatment, the field oxide film can be grown securely on the exposed region 14.

<Embodiment 2>

By covering the exposed region 14, which receives a cleaning process, with an oxide film in advance, the nitride 16 that will build up on the oxide film can be removed with the oxide film when removing the oxide film.

Figure 2A:
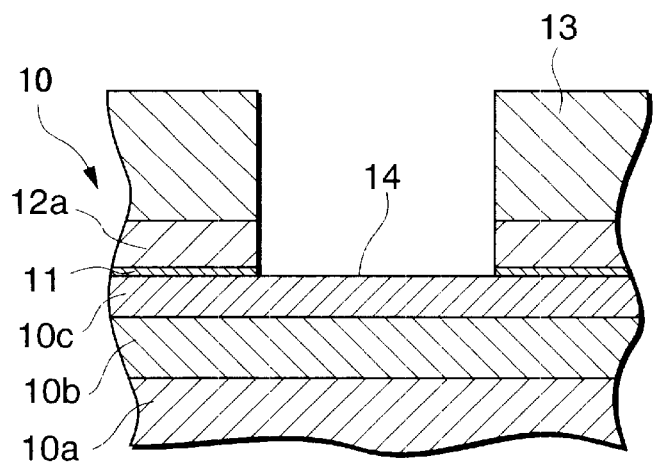
FIGS. 2(a) to 2(g) show the manufacturing steps of a method for forming an isolation region according to a second embodiment of according to the present invention.

Referring to FIG. 2(a), as in FIG. 18(c) of the first embodiment, after a silicon nitride layer 12 is formed on the substrate 10 through the intermediary of the pad film 11, by a selective etching process using the resist 13 patterned on the silicon nitride layer, the exposed region of the silicon nitride film 12 through the opening of the resist 13 and the pad film 11 beneath the exposed region are partially removed.

Figure 2B:
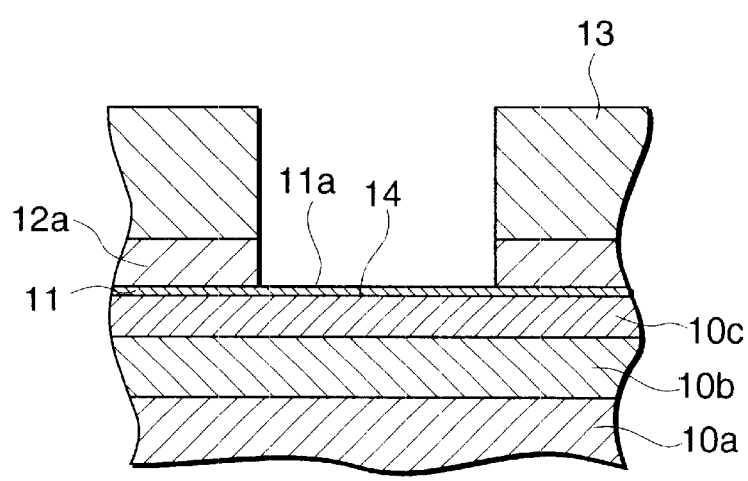
Figure 2C:
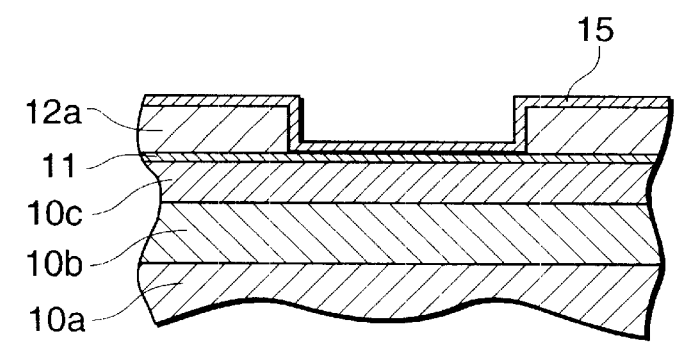

By a partial removal of the pad film 11 by the above-mentioned selective etching process, the SOI layer 10c as the surface of the substrate 10 is partially exposed, and an oxide film 11a with a thickness of 10 nm, for example, covering the exposed region 14 is formed by heat treatment on the exposed region 14, the oxide film being continuous to the remainder of the pad film 11 as shown in FIG. 2(b).

Subsequently, a side-wall material 15 the same as the one described with reference to FIG. 1(d) in the first embodiment is deposited on the oxide film 11a covering the exposed region 14 of the SOI layer 10c and on the patterned silicon nitride film serving as an oxidation inhibitor film 12a as shown in FIG. 2 (c).

Figure 2D:
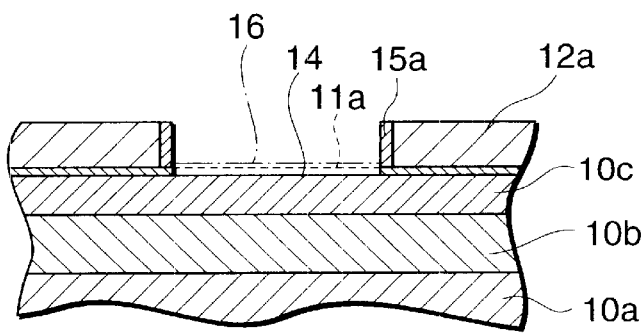

After the side-wall parts 15 are deposited, as shown in FIG. 2(d), the side-wall parts 15a are formed, which covers the edge portions of the silicon nitride film 12a, by a plasma etching process the same as that described with reference to FIG. 1(e).

By the earlier-mentioned plasma etching process for forming the side-wall parts 15a, a silicon nitride film material 16 is deposited on the oxide film 11a covering the exposed region 14 of the SOI layer 10c. Prior to the heat-treatment, a wet etching process using fluoric acid as an etchant, for example, is carried out on the exposed region 14, the oxide film 11a is removed, and the deposit 16 on the oxide film 11a is removed together with the oxide film 11a.

Figure 2E:
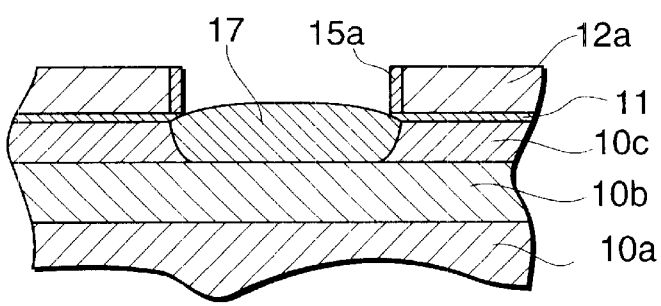

Therefore, by performing the cleaning process by a wet etching technique using fluoric acid on the exposed region 14, the cleaned SOI layer 10c, in other words, free of the nitride 16, is exposed through the opening of the silicon nitride film 12a, and by the heat-treatment described with reference to the first embodiment, silicon oxide 17 can be grown securely on the exposed region 14 as shown in FIG. 2(e).

Figure 2F:
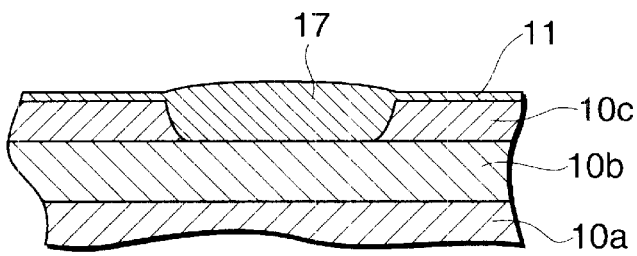
Figure 2G:
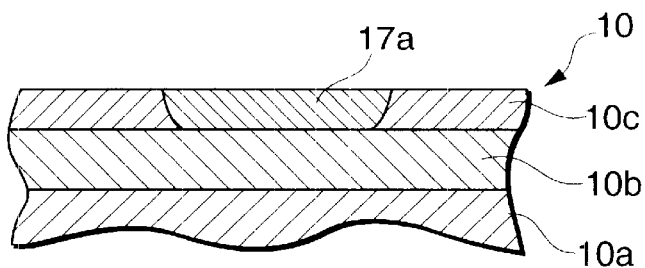

After the silicon oxide is formed, as in the first embodiment and as shown in FIG. 2(f), the silicon nitride film 12a and the side-wall parts 15a are removed. Thus, when the pad film 11 and the pad film 11 and the surface portion of the silicon oxide 17 continuous to the pad film 11 are removed by a conventional etching process such as has been used, the surface portion of the silicon oxide 17 being removed by the amount corresponding to the thickness of the pad film 11. Therefore, an isolation region 17a, which is the same as has been shown in the first embodiment, is obtained as shown in FIG. 2(g).

In the second embodiment that has been described, description has been made of a case where in a selective etching process using the resist 13, by partially removing the pad film 11, part of the SOI layer 10c is exposed temporarily as shown in FIG. 2(a), and after this, the oxide film 11a covering the exposed region 14 is formed as shown in FIG. 2(b). Instead of forming the oxide film 11a, after removing the silicon nitride film 12 by the above-mentioned selective etching process, by terminating the selective etching before the etching reaches the pad film 11, without partially removing the pad film 11, the portion of the pad film 11 which covers the exposed region 14 can be used as the above-mentioned oxide film.

However, because it is difficult to perform specified patterning of the silicon nitride film 12 to leave only the pad film 11 intact by the selective etching process, it is desirable to remove the silicon nitride film 12 and remove the pad film 11 partially by the selective etching process to temporarily and partially expose the SOI layer 10c and then form an oxide film 11a that covers this exposed region 14.

<Embodiment 3>

To show an example of a third embodiment of the present invention, in the above-mentioned plasma etching process for forming the side-wall parts 15a, the silicon nitride film 12a, which is the origin of the deposit 16 on the exposed region 14 of the SOI layer 10c, is covered with a protective film to inhibit the occurrence of the deposit 16.

Figure 3A:
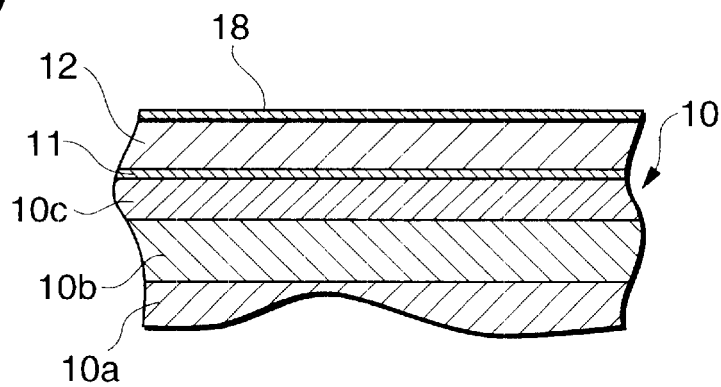
FIGS. 3(a) to 3(g) show the manufacturing steps of a method for forming an isolation region according to a third embodiment of according to the present invention.

In the third embodiment, as shown in FIG. 3(a), a silicon oxide film 12 is formed, through the intermediary of the pad film 11 of silicon oxide, on the SOI layer 10c of the substrate 10, and then a protective film 18 of silicon oxide is formed to a thickness of not more than 100 nm, for example, by CVD the same as has been described above.

Figure 3B:
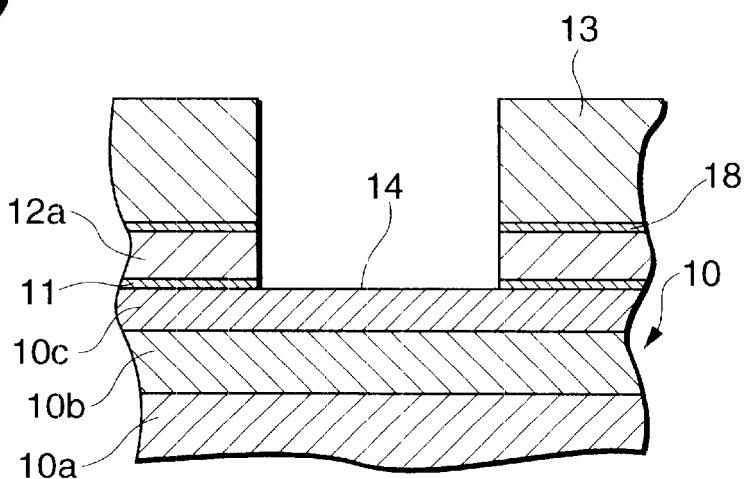

A resist 13 is formed with a desired pattern just as illustrated in the first and second embodiments on the protective film over the silicon nitride film 12 as shown in FIG. 3(b).

By a dry etching process using the resist 13 as the etching mask, the exposed region of the protective layer 18 which is not protected by the resist 13 and the silicon nitride film 12 and the pad film 11 under the exposed region are partially removed one layer after another. By this partial removal, the SOI layer 10c is partially exposed through the opening of the silicon nitride film 12a covered by the protective film 18a as the remainder of the protective film 18 patterned.

Figure 3C:
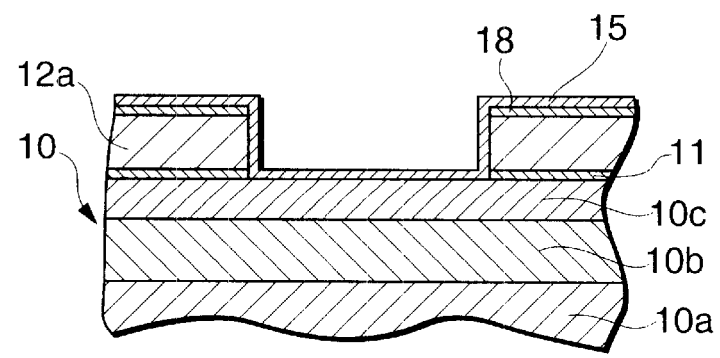

After the exposed region 14 is formed, when a side-wall material 15 is deposited on the exposed region 14 of the SOI layer 10c of the substrate 10, as shown in FIG. 3(c), the side-wall material 15 is deposited on the silicon nitride film 12 as well as on the exposed region 14 just as in the embodiments mentioned above. In the third embodiment, however, because the silicon nitride film 12a is covered by the protective film 18a, the side-wall material 15 builds up on the protective film 18a, not directly on the silicon nitride film 12a.

Figure 3D:
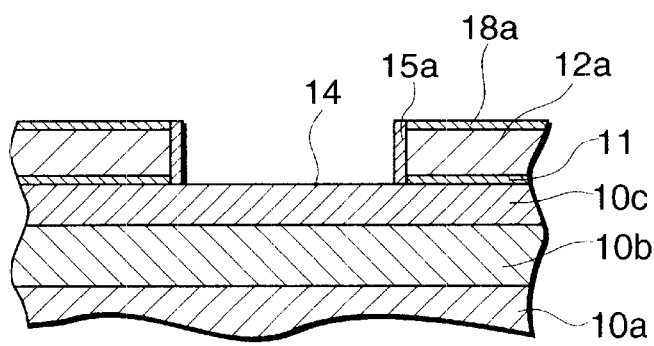

After the side-wall material 15 is deposited, by the same plasma etching process as that described above, as shown in FIG. 3(d), out of the side-wall material, its unnecessary portion on the exposed region 14 and the other unnecessary portion on the protective film 18 that covers the silicon nitride film 12a are removed barring the portion required to form the side-wall parts 15a.

In this plasma etching process, because the protective film 18a of silicon oxide on the silicon nitride film 12a serves as an etching stopper, the underlying silicon nitride film 12a is protected from the plasma etching.

Therefore, when those unnecessary portions of the side-wall material 15 are removed from the exposed region 14 and from the protective film 18a, the silicon nitride film 12a are protected from etching. For this reason, it never occurs that the silicon nitride film material 16 drifts in the plasma atmosphere in a large quantity—large enough to allow a considerable quantity of deposit 16 to builds up to inhibit the thermal oxidation of the exposed region 14 in heat treatment that follows the plasma etching process. Thus, the deposit 16 is prevented from accumulating on the exposed region 14 of the SOI layer 10c.

Figure 3E:
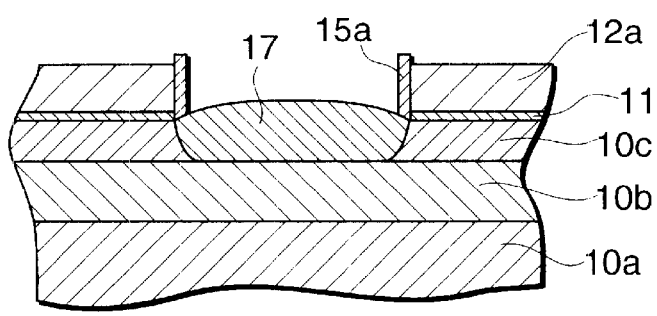

Therefore, as shown in FIG. 3(e), after the side-wall parts 15a are formed and after the protective film 18a has been removed from the silicon nitride film 12a with an etchant containing fluoric acid, for example, the substrate 10 is oxidized thermally, which securely causes oxidation of the exposed region 14 of the SOI layer 10c, and the exposed region 14 becomes silicon oxide 17.

Figure 3F:
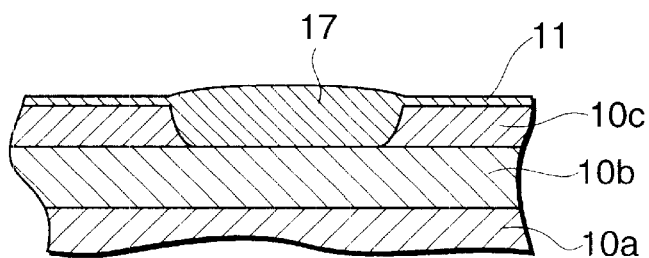
Figure 3G:
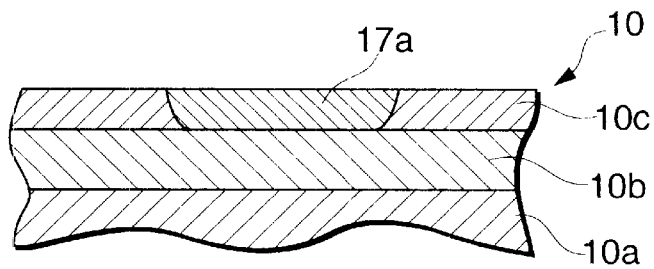

After the silicon oxide 17 is formed, in the same was as in the first and second embodiments, as shown in FIG. 3(f), the silicon nitride film 12a and the side-wall parts 15a are removed, which causes the pad film 11 to be exposed, and the pad film 11 and the silicon oxide 17 continuous to the pad film 11 are removed by the same etching process as has been used heretofore, the surface portion being removed by the amount corresponding to the thickness of the pad film 11. Thus, as shown in FIG. 3(g), an isolation region 17a is formed, which is the same as those formed in the first and second embodiments.

In the foregoing, description has been made of examples of using the SOI substrate, but the present invention is not limited to this substrate and may be applied to various kinds of semiconductor substrate that can be transformed into an electrically insulating material, such as a silicon crystal substrate, and for the oxidation inhibitor film, its material is not limited to a silicon nitride film, but various kinds of material that inhibit thermal oxidation of the semiconductor substrate may be adopted.

According to the present invention, as has been described, even if, owing to the plasma etching process to form the side-wall parts on the oxidation inhibitor film, particles of the material of the oxidation inhibitor film builds up on the exposed region of the semiconductor substrate which is revealed through an opening of the oxidation inhibitor film, this deposit can be removed from the exposed region by cleaning through an etching process, or the material of the oxidation inhibitor film is prevented from falling and accumulating on the exposed region by the use of a protective film on the oxidation inhibitor film. Therefore, even when the isolation regions are provided mutually secluded from one another, the field oxide film can be grown securely by heat treatment and the isolation regions made of this field oxide film can be formed with a high yield.

What is claimed is:

1. A method for forming an isolation region made of a field oxide film generated by thermal oxidation of an exposed region of the surface of a semiconductor substrate partially covered by an oxidation inhibitor film, comprising:

partially covering the surface of said semiconductor substrate with an oxidation inhibitor film;

depositing a material for side-wall parts on said oxidation inhibitor film and on an exposed region of said surface revealed through an opening of said oxidation inhibitor film to form side-wall parts at edge portions of said oxidation inhibitor film by a material having the same function as said oxidation inhibitor film;

then, removing by a plasma etching process unnecessary portions of said side-wall material deposited on said oxidation inhibitor film and on said exposed region of said semiconductor substrate and leaving intact said side-wall parts at the edge portions of said oxidation inhibitor film; and carrying out a cleaning process on said exposed region on the surface of said semiconductor substrate, revealed through the opening of said oxidation inhibitor film, before performing subsequent heat treatment to generate a field oxide film.

2. A method for forming an isolation region according to claim 1, wherein said cleaning process is a dry etching process chiefly using radicals.

3. A method for forming an isolation region according to claim 1, wherein said cleaning process is a wet etching process using an etchant.

4. A method for forming an isolation region according to claim 1, further comprising:

before depositing a material for said side-wall parts, covering said exposed region on the surface of said semiconductor with an oxide film; and after said unnecessary portions of said side-wall material are removed, removing said oxide film covering said exposed region by carrying out said cleaning process on said exposed region.

5. A method for forming an isolation region made of a field oxide film generated by thermal oxidation of an exposed region of the surface of a semiconductor substrate partially covered by an oxidation inhibitor film, comprising:

partially covering the surface of said semiconductor with an oxidation inhibitor film, the surface of said oxidation film being covered by a protective film;

depositing a material for side-wall parts on said oxidation inhibitor film and on an exposed region of said surface, revealed through an opening of said oxidation inhibitor film, to form side-wall parts at edge portions of said oxidation inhibitor film by a material having the same function as said oxidation inhibitor film;

then, by a plasma etching process, removing unnecessary portions of said side-wall material deposited on said protective film and on said exposed region on said semiconductor surface and leaving intact said side-wall parts at the edge portions of said oxidation inhibitor film; and carrying out heat treatment on said semiconductor substrate to generate said field oxide film.

* * * * *